United States Patent
Aichinger et al.

(10) Patent No.: US 9,934,972 B2
(45) Date of Patent: Apr. 3, 2018

(54) METHOD OF MANUFACTURING A SILICON CARBIDE SEMICONDUCTOR DEVICE BY REMOVING AMORPHIZED PORTIONS

(71) Applicant: Infineon Technologies AG, Neubiberg (DE)

(72) Inventors: Thomas Aichinger, Villach (AT); Wolfgang Bergner, Klagenfurt (AT); Romain Esteve, Villach (AT); Daniel Kueck, Villach (AT); Dethard Peters, Hoechstadt (DE); Victorina Poenariu, Villach (AT); Gerald Reinwald, Wernberg (AT); Roland Rupp, Lauf (DE); Gerald Unegg, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/288,349

(22) Filed: Oct. 7, 2016

(65) Prior Publication Data
US 2017/0103894 A1 Apr. 13, 2017

(30) Foreign Application Priority Data
Oct. 9, 2015 (DE) .................. 10 2015 117 286

(51) Int. Cl.
*H01L 21/04* (2006.01)
*H01L 21/02* (2006.01)
(Continued)

(52) U.S. Cl.
CPC ........ *H01L 21/0475* (2013.01); *H01L 21/049* (2013.01); *H01L 21/3065* (2013.01);
(Continued)

(58) Field of Classification Search
CPC ............... H01L 21/0475; H01L 21/049; H01L 21/3065; H01L 29/0661; H01L 29/1095;
(Continued)

(56) References Cited

U.S. PATENT DOCUMENTS 5,436,174 A    7/1995   Baliga et al.
5,742,076 A * 4/1998   Sridevan ............... H01L 21/049
                                           257/289
(Continued)

FOREIGN PATENT DOCUMENTS

DE    102005024073 A1    11/2006
JP      H09-503101           3/1997
(Continued)

OTHER PUBLICATIONS

Office Action communication of the German Patent and Trademark Office for Appln. Ser. No. 102015117286.0, dated Jun. 28, 2016.
(Continued)

*Primary Examiner* — Dao H Nguyen
(74) *Attorney, Agent, or Firm* — Slater Matsil, LLP

(57) ABSTRACT

A trench is formed that extends from a main surface into a crystalline silicon carbide semiconductor layer. A mask is formed that includes a mask opening exposing the trench and a rim section of the main surface around the trench. By irradiation with a particle beam a first portion of the semiconductor layer exposed by the mask opening and a second portion outside of the vertical projection of the mask opening and directly adjoining to the first portion are amorphized. A vertical extension of the amorphized second portion gradually decreases with increasing distance to the first portion. The amorphized first and second portions are removed.

21 Claims, 13 Drawing Sheets

(51) Int. Cl.
- *H01L 21/265* (2006.01)
- *H01L 29/78* (2006.01)
- *H01L 29/66* (2006.01)
- *H01L 29/16* (2006.01)
- *H01L 29/10* (2006.01)
- *H01L 29/40* (2006.01)
- *H01L 29/861* (2006.01)
- *H01L 29/06* (2006.01)
- *H01L 21/3065* (2006.01)
- *H01L 29/423* (2006.01)

(52) U.S. Cl.
CPC ...... *H01L 29/0661* (2013.01); *H01L 29/1095* (2013.01); *H01L 29/1608* (2013.01); *H01L 29/401* (2013.01); *H01L 29/4238* (2013.01); *H01L 29/66068* (2013.01); *H01L 29/7813* (2013.01); *H01L 29/8613* (2013.01); *H01L 29/0696* (2013.01); *H01L 29/42376* (2013.01)

(58) Field of Classification Search
CPC ............... H01L 29/1608; H01L 29/401; H01L 29/4238; H01L 29/66068; H01L 29/7813; H01L 29/8613
USPC ... 257/77, 78, 331, 341, 288, 289, 230, 231, 257/232, 245, E21.063, E21.066, E21.09, 257/E21.134, E21.331, E21.334, E29.004, 257/E29.104, E29.2, E29.201, E29.257; 438/166, 478, 481, 487, 798
See application file for complete search history.

(56) References Cited

U.S. PATENT DOCUMENTS

| | | | | |
|---|---|---|---|---|
| 7,855,415 | B2* | 12/2010 | Challa | H01L 21/3065 257/331 |
| 9,450,068 | B2* | 9/2016 | Takeuchi | H01L 29/66068 |
| 2010/0055882 | A1* | 3/2010 | Imhoff | H01L 21/0465 438/481 |
| 2013/0168701 | A1* | 7/2013 | Kiyosawa | H01L 21/0475 257/77 |
| 2013/0309851 | A1* | 11/2013 | Tarui | H01L 21/046 438/514 |
| 2014/0021590 | A1* | 1/2014 | Schulze | H01L 29/0619 257/655 |

FOREIGN PATENT DOCUMENTS

| | | |
|---|---|---|
| JP | 2002-516027 | 5/2002 |
| JP | 2006-228901 | 8/2006 |
| JP | 2014-107571 | 6/2014 |
| JP | 2015-132665 | 2/2015 |
| JP | 2015135862 A | 7/2015 |
| KR | 20090084825 A | 8/2009 |
| KR | 20140068036 A | 6/2014 |
| WO | WO 2012/127821 | 9/2012 |
| WO | WO 2013/042333 | 3/2013 |

OTHER PUBLICATIONS

Japanese Office Action; 2016-198751; 10 pages including machine translation, dated Oct. 24, 2017.

\* cited by examiner

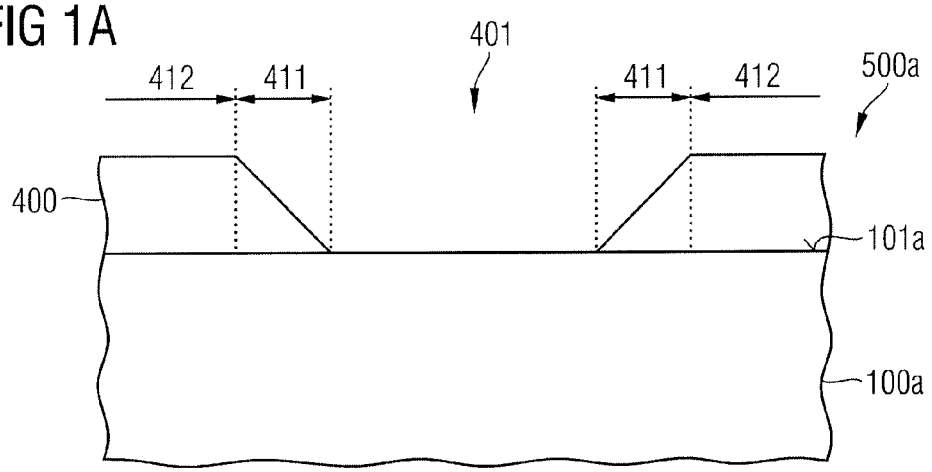
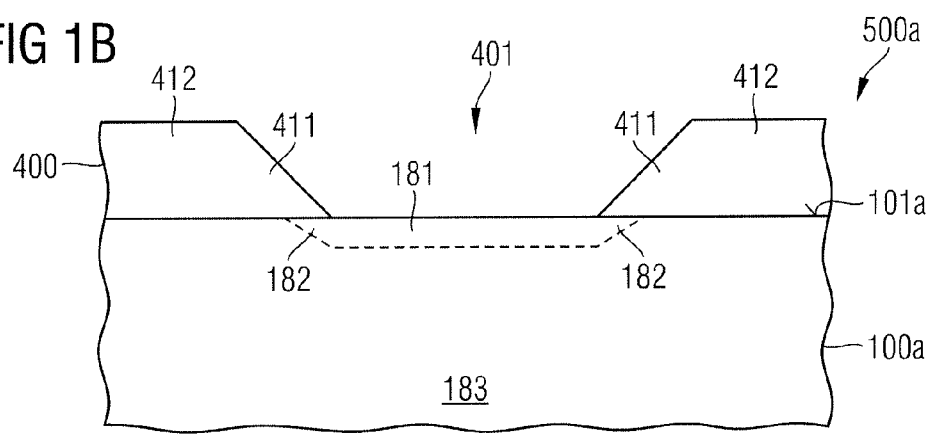
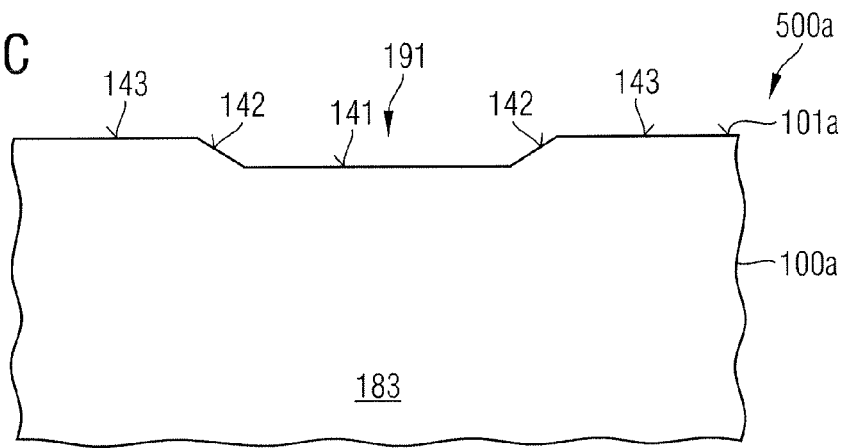

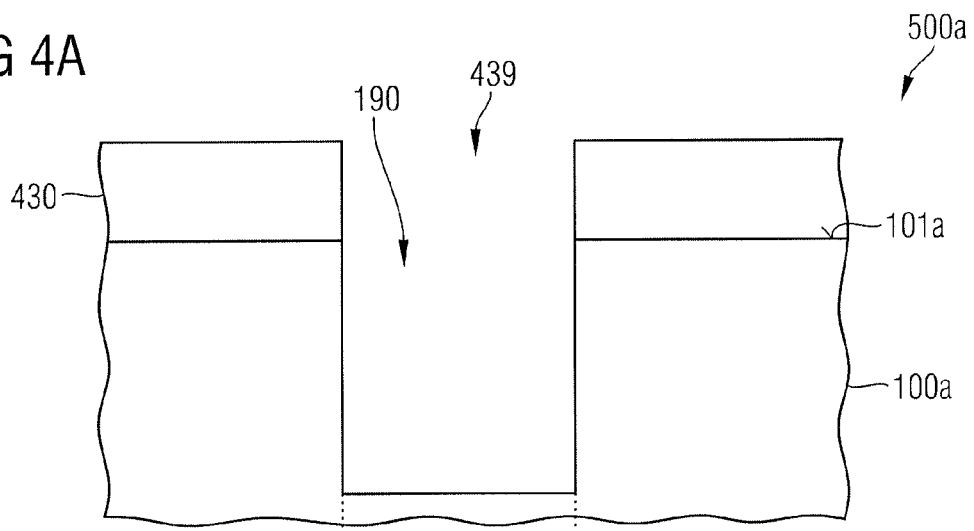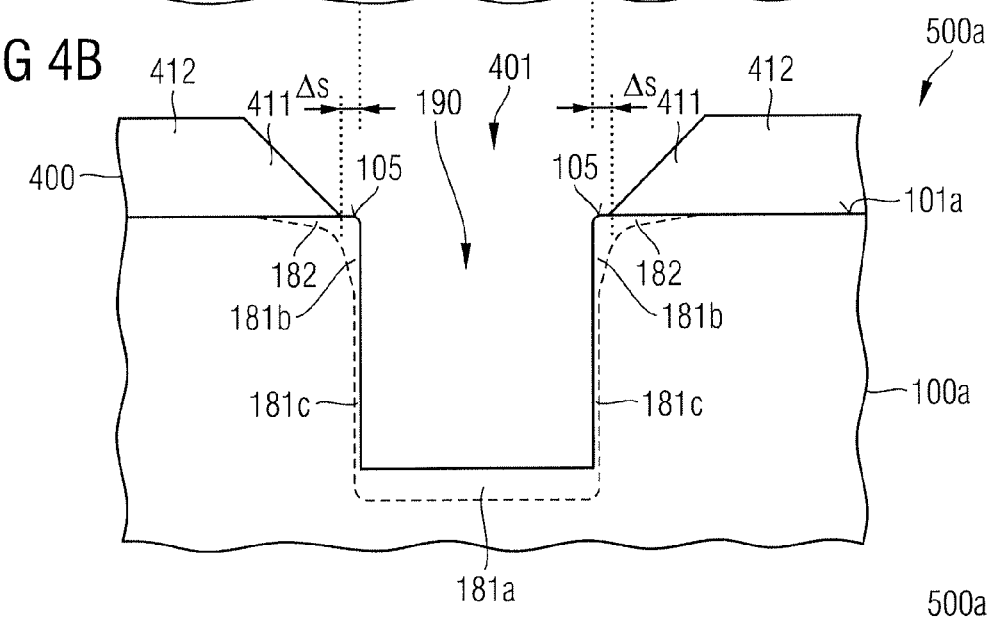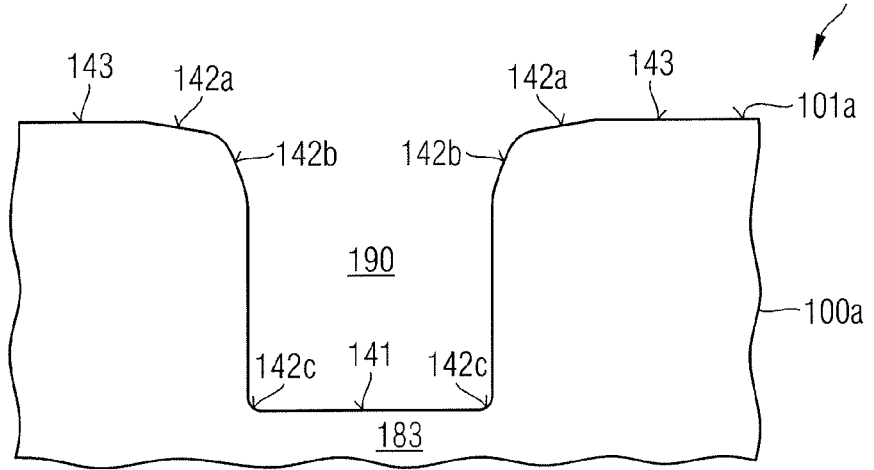

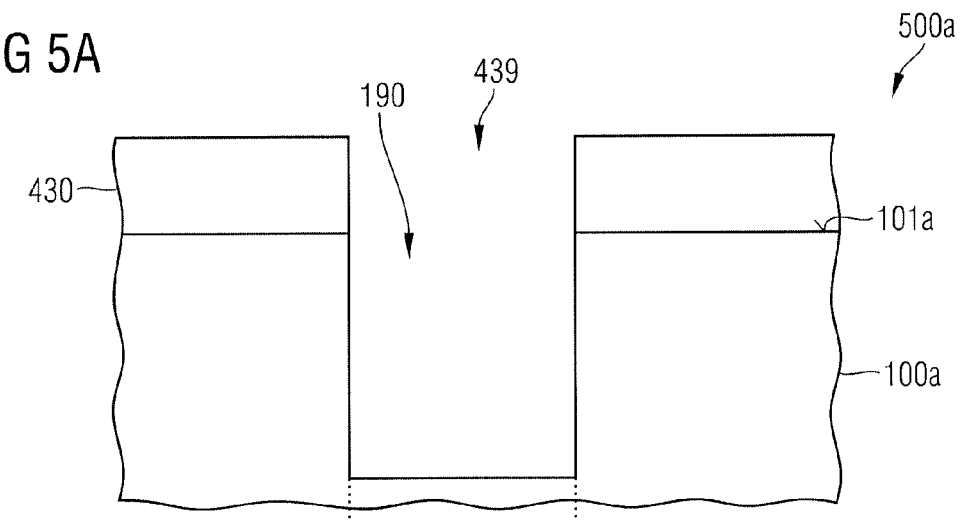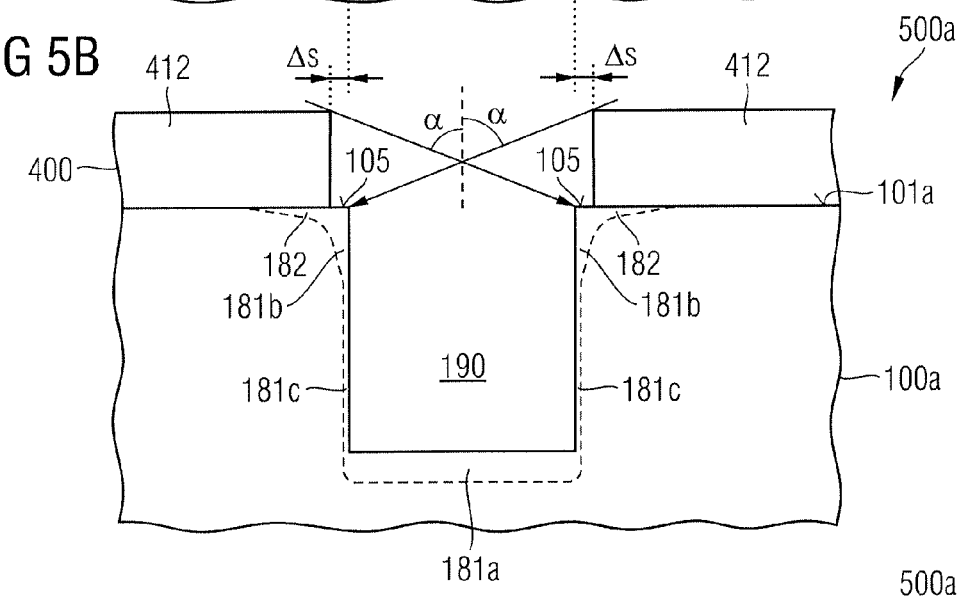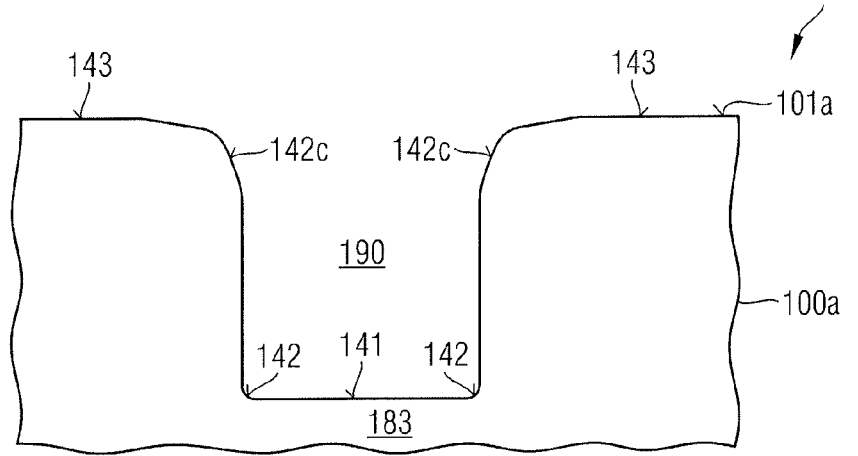

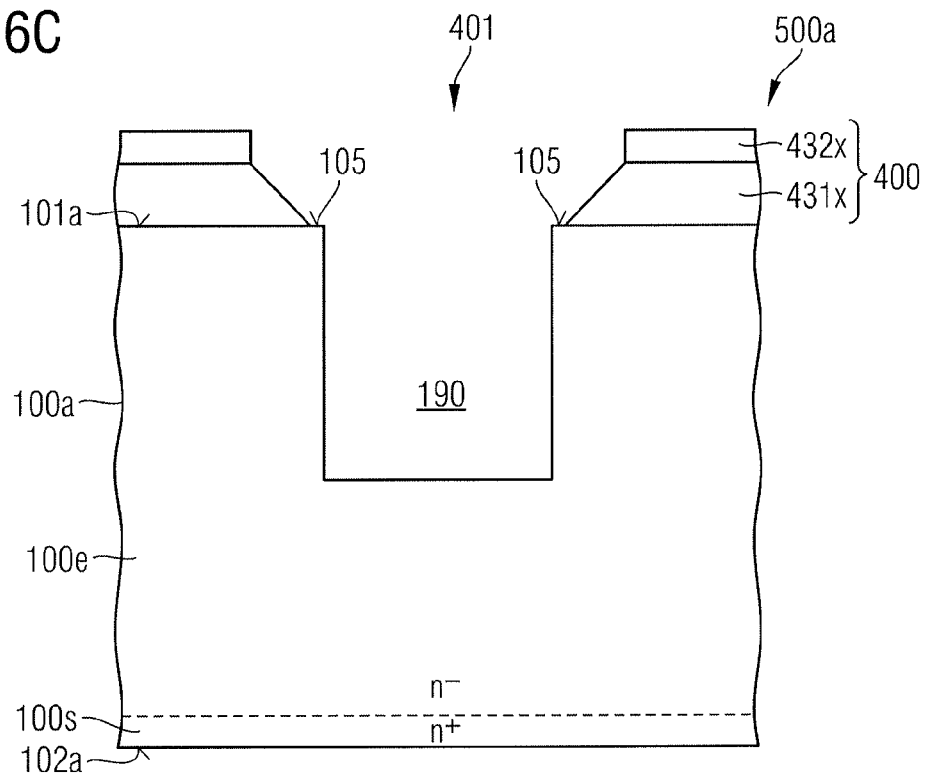
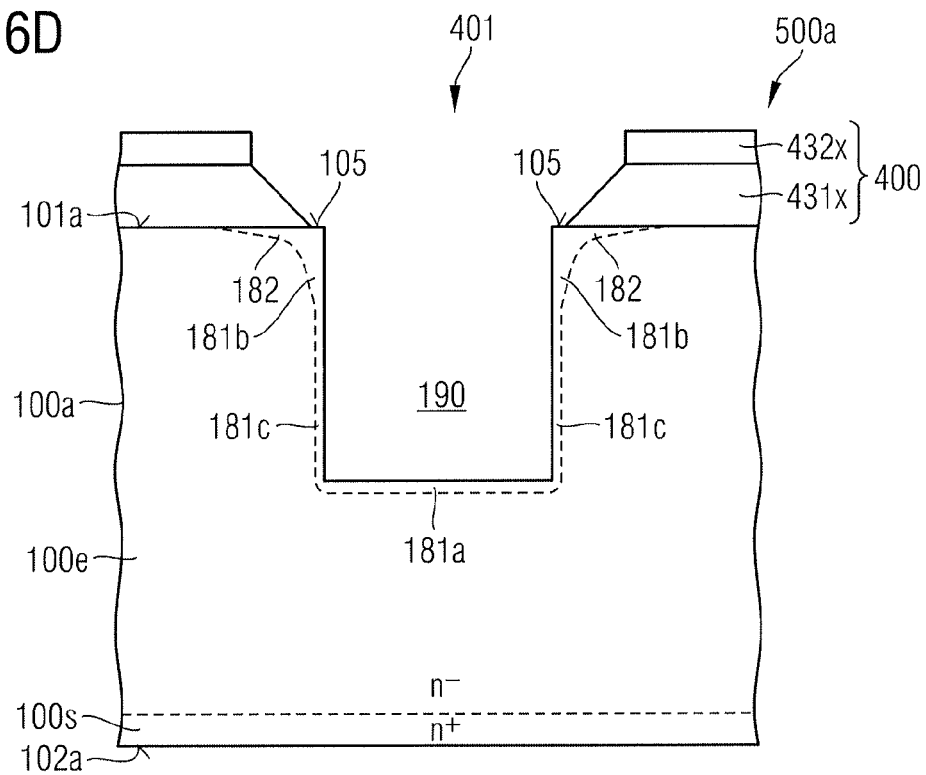

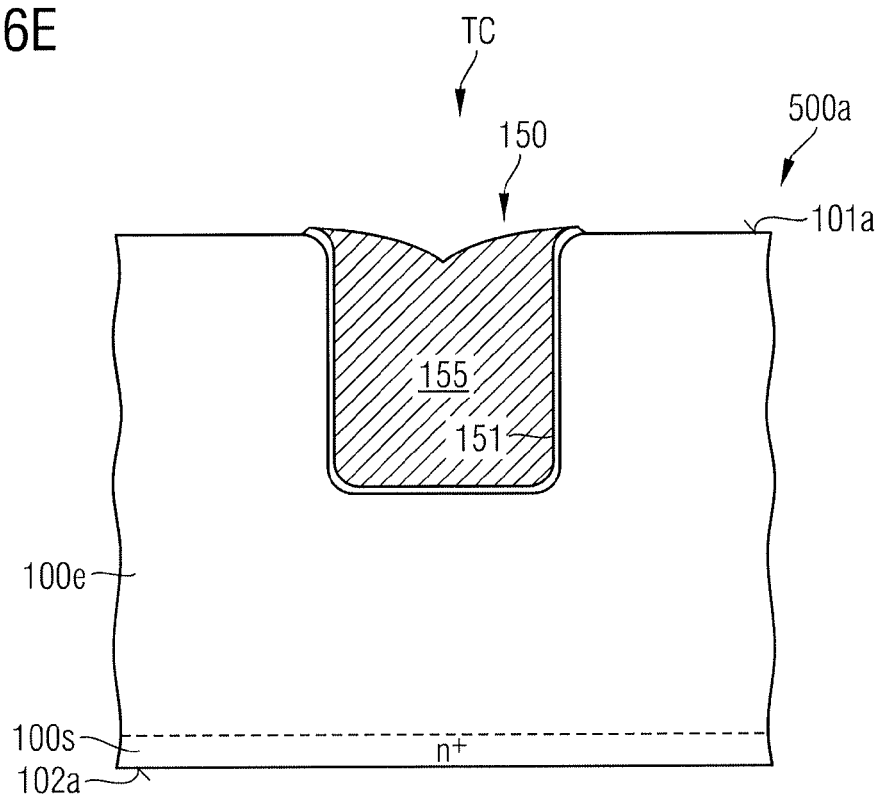

METHOD OF MANUFACTURING A SILICON CARBIDE SEMICONDUCTOR DEVICE BY REMOVING AMORPHIZED PORTIONS

CROSS-REFERENCE TO RELATED APPLICATION

This application claims priority to German Application Serial No. 102015117286.0 filed Oct. 9, 2015 and entitled "Method of Manufacturing a Silicon Carbide Semiconductor Device by Removing Amorphized Portions".

BACKGROUND

Due to high breakdown electric field strength and high electron saturation velocity of silicon carbide (SiC), semiconductor devices based on SiC are provided for high temperature, high power and high frequency electronic semiconductor devices. High chemical stability of single crystalline SiC results in pure solubility in liquid etchants such that patterning of SiC surfaces for the formation of steps and trenches usually cannot rely on wet etching processes. Reactive ion etching, on the other hand, is highly anisotropic and typically results in comparatively rough surfaces and sharp-edged corners and steps. Heating treatments at temperatures above 1500° C. may smooth surface roughness and may round to some degree sharp-edged corners.

It is desirable to round or to chamfer steps as well as rims of trenches in semiconductor devices based on silicon carbide at less effort.

SUMMARY

According to an embodiment a method of manufacturing a semiconductor device includes forming a trench extending from a main surface into a crystalline silicon carbide semiconductor layer. A mask is formed that includes a mask opening exposing the trench and a rim section of the main surface around the trench. By irradiation with a particle beam a first portion of the semiconductor layer exposed by the mask opening and a second portion outside of the vertical projection of the mask opening and directly adjoining to the first portion are amorphized, wherein a vertical extension of the amorphized second portion gradually decreases with increasing distance to the first portion. The amorphized first and second portions are removed.

According to a further embodiment, a method of manufacturing a semiconductor device includes forming a mask on a crystalline silicon carbide semiconductor layer. The mask includes a mask opening and a first mask section that tapers with decreasing distance to the mask opening. By irradiation with a particle beam, a first portion of the semiconductor layer exposed by the mask opening and a second portion in a vertical projection of the first mask section and directly adjoining to the first portion are amorphized, wherein a vertical extension of the second portion gradually decreases with increasing distance to the first portion. The amorphized first and second portions are removed.

According to another embodiment, a method of manufacturing a semiconductor device includes forming a mask including a mask opening on a crystalline silicon carbide semiconductor layer. By irradiation with a particle beam, a first portion of the semiconductor layer exposed by the mask opening and a second portion in a vertical projection of the mask and directly adjoining to the first portion are amorphized. The amorphized first and second portions are removed. Amorphizing and removing of first and second portions are repeated at least once to form a stepped recess, wherein the mask opening is enlarged before each amorphizing.

According to a further embodiment, a semiconductor device includes a trench gate structure extending from a first surface into a semiconductor body of crystalline silicon carbide. The trench gate structure fills a trench rounded and/or chamfered along a rim section of the first surface. In a horizontal cross-section parallel to the first surface the trench gate structure includes straight long sides, straight short sides and rounded transitions between the short and long sides.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A is a schematic vertical cross-sectional view of a portion of semiconductor substrate for illustrating a method of manufacturing a semiconductor device including buried structures with chamfered and/or rounded edges by amorphizing portions of the substrate by means of a mask with tapering mask sections, after forming the tapering mask sections.

FIG. 1B shows the semiconductor substrate portion of FIG. 1A after amorphizing portions of the substrate.

FIG. 1C shows the semiconductor substrate portion of FIG. 1B after removing the amorphized portions.

FIG. 4A is a schematic vertical cross-sectional view of a portion of a semiconductor substrate for illustrating a method of manufacturing a semiconductor device according to an embodiment including chamfering rims of trenches by the use of a mask with tapering mask sections, after forming the trenches.

FIG. 4B shows the semiconductor substrate portion of FIG. 4A after amorphizing portions of the substrate.

FIG. 4C shows the semiconductor substrate portion of FIG. 4B after removing the amorphized portions.

FIG. 5A is a schematic vertical cross-sectional view of a portion of a semiconductor substrate for illustrating a method of manufacturing a semiconductor device according to an embodiment including chamfering rims of trenches by the use of tilted implants, after forming the trenches.

FIG. 5B shows the semiconductor substrate portion of FIG. 4A, during amorphizing portions of the substrate by a tilted implant.

FIG. 5C shows the semiconductor substrate portion of FIG. 5B after removing the amorphized portions.

FIG. 6C shows the semiconductor substrate portion of FIG. 6B after modifying the multi-layer mask.

FIG. 6D shows the semiconductor substrate portion of FIG. 6C after amorphizing substrate portions by the use of the modified multi-layer mask.

FIG. 6E shows the semiconductor substrate portion of FIG. 6D after forming a trench gate structure in the trench.

DETAILED DESCRIPTION

Figure 2A:
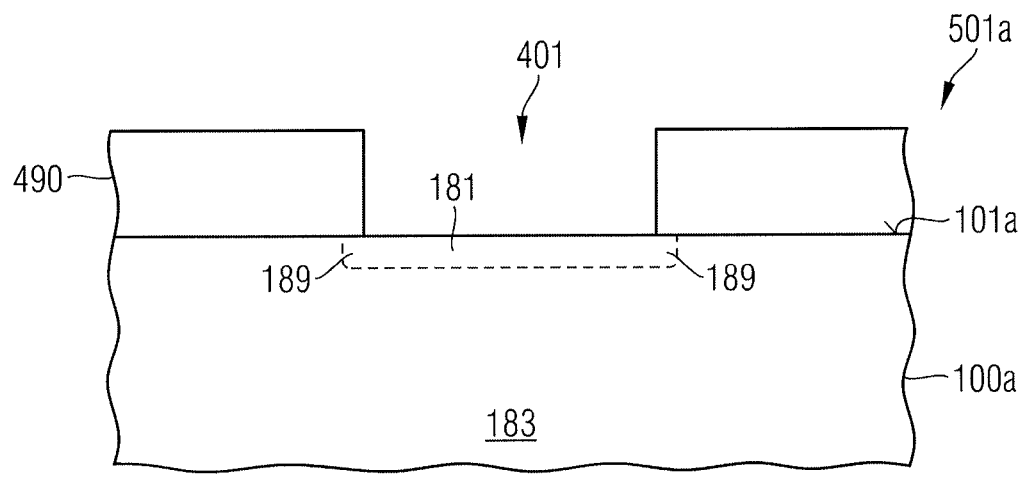
FIG. 2A is a schematic vertical cross-sectional view of a portion of a semiconductor substrate for illustrating a comparative method using a mask without tapering mask sections for discussing effects of the embodiments, after amorphizing portions of a substrate by the use of a mask without tapering mask sections, after amorphizing portions of the substrate.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or a highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1C refer to the use of a mask 400 with tapered first mask sections 411 for locally recessing a main surface 101a of a semiconductor layer 100a which is based on single crystalline silicon carbide.

FIG. 1A shows a semiconductor substrate 500a including a semiconductor layer 100a which may consist of or may include single crystalline silicon carbide (SiC), for example 2H—SiC (SiC of the 2H polytype), 6H—SiC or 15R—SiC. According to an embodiment, the semiconductor layer 100a is of silicon carbide of the 4H-polytype (4H—SiC). The semiconductor layer 100a may include a base substrate obtained by cutting a slice from a silicon carbide ingot and an epitaxy layer grown by epitaxy on a process surface of the base substrate, wherein the base substrate may be heavily doped and the epitaxy layer may be weakly doped. Outside of the illustrated portion the semiconductor substrate 500a may include further conductive, insulating, and/or semiconducting portions.

The semiconductor layer 100a may be approximately cylindrical with a main surface 101a at a front side and a supporting surface on the back opposite to the main surface 101a. The main surface 101a may be a planar surface or a mean surface intersecting staggered surface sections parallel to a main crystal direction and tilted to the main surface 101a by, e.g., about 4 degree.

A normal to the main surface 101a defines a vertical direction. Directions parallel to the main surface 101a are horizontal directions.

A mask 400 with a mask opening 401 is formed on the main surface 101a. The mask 400 may include one single mask layer or may be a multi-layer mask including two or more sublayers sequentially deposited one onto the other.

FIG. 1A shows a tapering first mask section 411 that surrounds the mask opening 401, wherein in the first mask section 411 the mask 400 tapers with decreasing distance to the mask opening 401. The tapering may be approximately linear, as illustrated, wherein a rate at which the first mask section 411 tapers is approximately uniform. According to other embodiments, the rate at which the first mask section 411 tapers may increase with decreasing distance to the mask opening 401. In a second mask section 412, a thickness of the mask 400 may be at least approximately uniform and at least equal to a maximum thickness in the tapering first mask section 411.

The mask 400 may be or may include a material that can be etched highly isotropically. According to an embodiment, the mask material is or contains silicon oxide ($SiO_2$), silicon (Si) or platinum (Pt).

In a first portion 181 of the semiconductor layer 100a in the vertical projection of the mask opening 401 and in a second portion 182 within the vertical projection of the first mask section 411, the crystal lattice of the semiconductor layer 100a is damaged. For example, a particle beam is vertically irradiated onto the main surface 101a, wherein the second mask section 412 almost completely shields a third portion 183 of the semiconductor layer 100a against the particle beam, the first mask section 411 only partially shields underlying portions of the semiconductor layer 100a against the particle beam, and the particle beam passes without attenuation through the mask opening 401.

The particle beam may be an electron beam, a neutron beam or an ion beam. For example, the particle beam contains ions of group 14 elements such as germanium (Ge), tin (Sn), and lead (Pb), or ions of group 18 elements such as neon (Ne), argon (Ar), krypton (Kr) or xenon (Xe). According to a further embodiment, the particle beam includes silicon ions/atoms and carbon ions/atoms at a ratio of approximately 1:1. The particle beam 990 provides particles at an implant dose sufficiently high to significantly damage the crystal lattice such that at a scale from perfectly crystalline to fully amorphous, the particle beam 990 brings the semiconductor layer 100a closer to the amorphous end.

The critical dose depends on the binding energy of the silicon-carbon bonds, the crystal lattice density of the SiC crystal, and a nuclear stopping power of the SiC crystal for a given particle species. The critical dose is about $1E15\ cm^{-2}$ for aluminum ions, about $2E18\ cm^{-2}$ for hydrogen ions and about $4.8E14\ cm^{-2}$ for argon ions.

The particle beam 990 damages the crystal lattice of the semiconductor layer 100a in the first and second portions 181, 182 thereby amorphizing the semiconductor layer 100a to the effect that after irradiation with the particle beam 990 the crystal lattice of the semiconductor layer 100a is less perfect than before and includes a significant amount of crystal defects such as lattice vacancies. The extent of damage may be high enough to consider the first and second portions 181, 182 as amorphous. According to an embodiment, an overall defect density in the crystal lattice of the first and second portions 181, 182 is at least $1E21\ cm^{-3}$. According to another embodiment the first and second portions 181, 182 are fully amorphous.

FIG. 1B shows an amorphized first portion 181 of the semiconductor layer 100a in the vertical projection of the mask opening 401 and an amorphized second portion 182 in the vertical projection of the tapered first mask sections 411. No amorphization takes place in a third portion 183 shielded by the second mask portion 412. A vertical extension of the amorphized first and second portions 181, 182 depends on the species of the particles, may depend on the acceleration energy of the particles in the particle beam and may be, e.g., about 300 nm for aluminum ions implanted at an acceleration energy of 200 keV.

Particles scattered from the vertical direction may amorphize portions of the semiconductor layer 100a outside of the vertical projection of the particle beam. In addition, the varying thickness of the tapering first mask section 411 gradually reduces the range of the particles with increasing distance to the mask opening 401 such that the tapering first mask section 411 results in that the second portion 182 also gradually tapers with increasing distance to the first portion 181 along at least a portion of the horizontal extension of the tapering first mask section 411. A rate, at which the vertical extension of the second portion 182 decreases, may correspond to the rate at which the first mask sections 411 tapers and be approximately linear or may decrease with increasing distance to the first portion 181.

After amorphization of the first and second portions 181, 182 the mask 400 is removed. In the same process or later the amorphized first and second portions 181, 182 may be removed, for example, by using an etchant containing fluorine (F) and an oxidizing chemical such as a buffered HF, e.g., an 1:1 mixture of hydrofluoric acid (HF) and nitric acid ($HNO_3$), for example, in a mixture of $HF:HNO_3$ at approximately 1:1 by volume. The wet etching removes the amorphized first and second portions 181, 182 with high selectively against the non-amorphized third portion 183.

FIG. 1C shows a recess 191 formed in the main surface 101a by removing the amorphized first and second portions 181, 182. A bottom surface 141 of the recess 191 is parallel to unrecessed portions of the main surface 101a. A smoothly chamfered transition surface 142 results from removal of the tapering amorphized second portions 182. The recess 191 does not show any sharp-edged features, i.e., a maximum feature angle in the third portion 183 is greater 120 degree.

Other than conventional methods of rounding sharp-edged features in SiC substrates, the method gets along without any time-consuming heating treatment at temperatures above 1500° C., which may also induce unwanted redeposition processes of the SiC material and segregation of dopants.

Figure 2B:
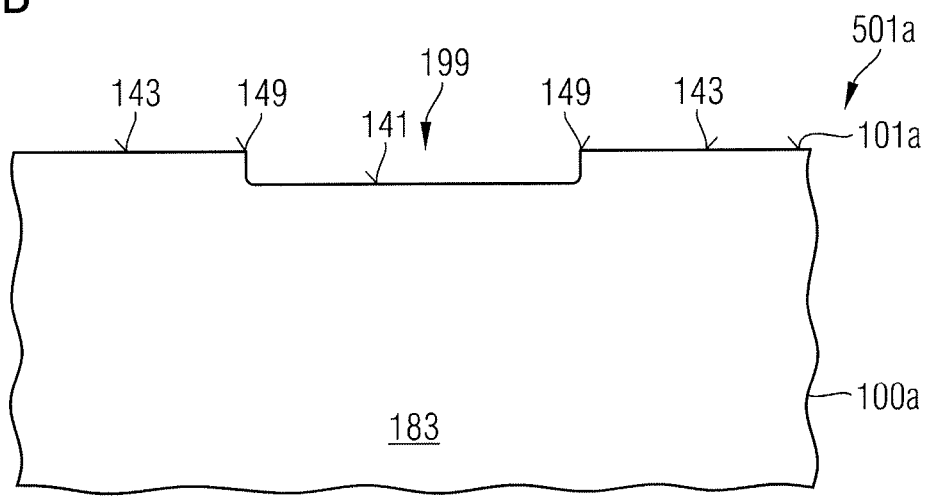
FIG. 2B shows the semiconductor substrate portion of FIG. 2A after removing the amorphized portions.

FIGS. 2A to 2B refer to a comparative method using a reference mask 490 including a mask opening 401 with vertical sidewalls. A particle beam irradiating a comparative substrate 501a including an SiC semiconductor layer 100a from the front side directly amorphizes a first portion 181 of the semiconductor layer 100a in the vertical projection of the mask opening 401.

As illustrated in FIG. 2A, scattered particles deflected from the vertical direction may amorphize a transition portion 189 in the vertical projection of a portion of the reference mask 490 directly adjoining the mask opening 401 and outside of the vertical projection of the mask opening 401. A horizontal range of the scattered particles is small compared to the vertical extension of the first portion 181 such that an interface plane between the transition portion 189 and a non-amorphized third portion 183 of the semiconductor layer 100a is predominantly vertical and a vertical extension of the transition portion 189 changes abruptly.

FIG. 2B shows a comparative recess 199 obtained by the comparative method after removing the reference mask 490, the amorphized first portion 181, as well as the amorphized transition portion 189 of FIG. 2A. The steep sidewalls of the amorphized transition portions 189 of FIG. 2A result in sharp edges 149 with a feature angle of about 90° along the rim of the comparative recess 199 in the comparative substrate 501a.

FIGS. 3A to 3D refer to a method of forming stepped recesses with smooth transitions in a main surface 101a of an SiC semiconductor substrate 500a including a semiconductor layer 100a based on single crystalline silicon carbide. A first mask 400a includes a first mask opening 401a with a tapered first mask section 411 and a second mask section 412, which vertical extension may be uniform. A first portion 181 of the semiconductor layer 100a in the vertical projection of the first mask opening 401a and a second portion 182 within the vertical projection of the tapering first mask section 411 are amorphized as described above.

Figure 3A:
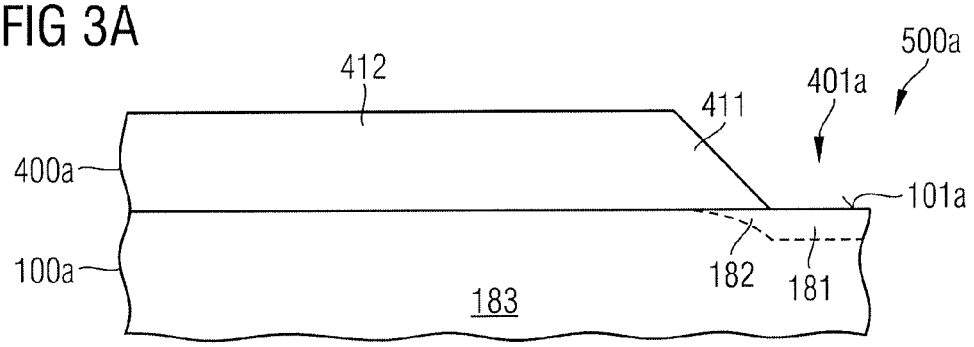
FIG. 3A is a schematic vertical cross-sectional view of a portion of a semiconductor substrate for illustrating a method of manufacturing a semiconductor device including surface steps, after forming amorphized portions in the substrate by the use of a mask with tapered mask sections.

FIG. 3A shows the amorphized second portion 182 which vertical extension gradually decreases with increasing distance to the first portion 181.

The amorphized first and second portions 181, 182 are removed by a wet etch process, for example by the use of a 1:1 mixture of HF:HNO$_3$, to form a first recess 191a.

Figure 3B:
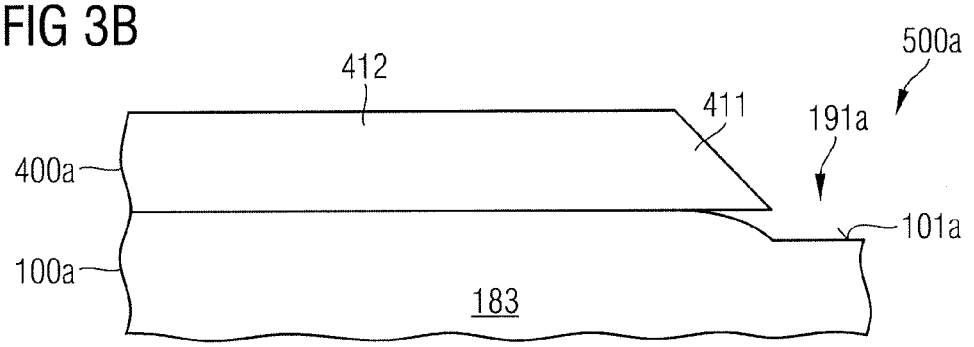
FIG. 3B is a schematic cross-sectional view of the semiconductor substrate portion of FIG. 3A, after removing the amorphized substrate portions.
Figure 3C:
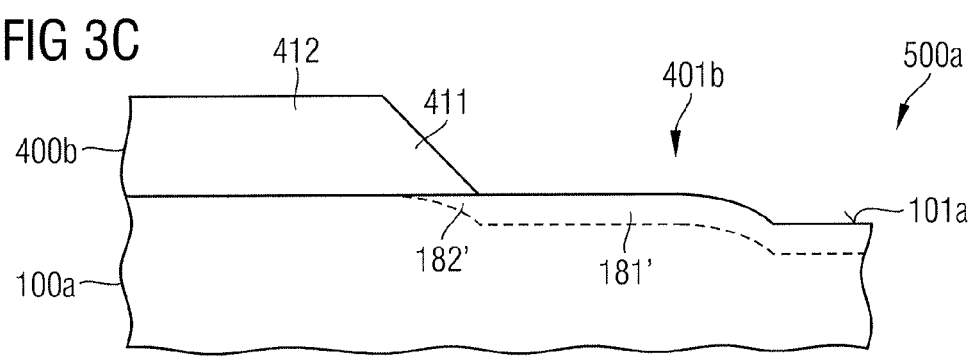
FIG. 3C shows the semiconductor substrate portion of FIG. 3B after forming further, amorphized portions.

As shown in FIG. 3B, the contour of the first recess 191a follows the contour of the interface between the amorphized first and second portions 181, 182 at one side and the non-amorphized third portion 183 of the semiconductor layer 100a of FIG. 3A at the other side.

The first mask 400a may be modified or replaced with a second mask 400b with a second mask opening 401b that includes the area exposed by the first mask opening 401a of FIG. 3A and further portions of the semiconductor layer 100a directly adjoining the first recess 191a. For example, the second mask 400b may result from an isotropic recess of the first mask 400a of FIGS. 3A and 3B, or by a further lithography process. A further first portion 181 of the semiconductor layer 100a exposed by the second mask opening 401b and a further second portion 182 in the vertical projection of a tapering first mask section 411 of the second mask 400b are amorphized, e.g., by irradiation with a particle beam 990 to the effect that after irradiation with the particle beam the crystal lattice in the further first and second portions 181, 182 is less perfect than before and at a scale from perfectly crystalline to fully amorphous, the first and second portions 181, 182 get closer to the amorphous end. The amorphized further first and second portions 181, 182 and the second mask 400b are removed.

Figure 3D:
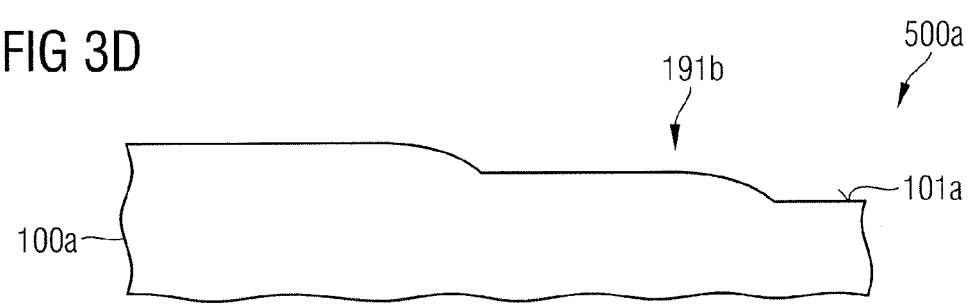
FIG. 3D shows the semiconductor substrate portion of FIG. 3C after removing the further, amorphized portions.

FIG. 3D shows the resulting stepped recess 191b with smooth transitions resulting in smooth field gradients.

FIGS. 4A to 4C refer to an embodiment with tapering mask sections used in combination with a laterally recessed mask for rounding and/or chamfering edges along the rim of a trench.

A precursor mask 430, which is a single-layer mask or a multi-layer mask, is formed on the main surface 101a at a front side of a semiconductor layer 100a of a semiconductor substrate 500a as described with reference to FIG. 1A. The precursor mask 430 is patterned by photolithography and includes a precursor mask opening 439. Reactive ion beam etching etches a trench 190 into the semiconductor layer 100a in the vertical projection of the precursor mask opening 439. The reactive ion beam etching is highly anisotropic and the trench sidewalls may be approximately vertical.

FIG. 4A shows the trench 190 formed in the semiconductor layer 100a. Due to the high anisotropy of the etch, edges around the rim of the trench 190 and edges along the bottom of the trench 190 are sharped-edged and show a feature angle of about 90°.

The precursor mask 430 is than modified to or replaced with a mask 400 with a mask opening 401 greater than the precursor mask opening 439 of FIG. 4A. In addition, the mask 400 may include tapered first mask sections 411, wherein a vertical extension of the tapered first mask sections 411 increases with increasing distance to the mask opening 401. The greater mask opening 401 results in that a rim section 105 of the main surface 101a around the rim of the trench 190 is exposed. A width Δs of the rim section 105 may be in a range from 5 nm to 100 nm, by way of example. A first portion 181 of the semiconductor layer 100a in the vertical projection of the mask opening 401 and a second portion 182 in the vertical projection of the tapered first mask section 411 are amorphized, for example, by irradiating the semiconductor substrate 500a with a particle beam from the front side, wherein a dose of the particle beam exceeds a particle-specific critical dose beyond which crystalline SiC amorphizes to the effect that after irradiation with the particle beam the crystal lattice in the further first and second portions 181, 182 is less perfect than before and at a scale from perfectly crystalline to fully amorphous, the first and second portions 181, 182 get closer to the amorphous end.

FIG. 4B shows the amorphized first and second portions 181, 182, wherein the first portion 181 includes a first section 181a along the bottom of the trench 190, a second section 181b in the vertical projection of the exposed rim section 105 and a third section 181c along the vertical sidewall of the trench 190. The amorphized second portion 182 tapers with increasing distance to the trench 190 and the second section 181b of the first portion 181 further smooths the transition between the amorphized first and second portions 181, 182. In the region of the second sections 181b, the effects of amorphizing particles passing through the vertical sidewalls and particles passing through the exposed rim section 105 superpose such that a horizontal extension of the second sections 181b slightly increases with decreasing distance to the main surface 101a.

The mask 400 as well as the amorphized first and second portions 181, 182 are removed.

As illustrated in FIG. 4C the resulting trench 190 includes a chamfered and rounded rim including a tilted surface section 142b mainly defined by the lateral extension of the second section 181b of the amorphized first portion 181 and a tapering surface section 142a mainly defined by the tapering amorphized second portion 182. Scattering effects at the bottom of the trench 190 may further generate rounded surface sections 142c along the corners at the trench bottom 190.

FIGS. 5A to 5C refer to another method of chamfering and/or rounding the rim of a trench 190 extending from a main surface 101a into a crystalline silicon carbide semiconductor layer 100a.

A precursor mask 430 is deposited and patterned by photolithography such that a precursor mask opening 439 in the precursor mask 430 is formed with vertical sidewalls and exposes a portion of the main surface 101a of the semiconductor layer 100a.

FIG. 5A shows a trench 190 formed in the semiconductor layer 100a as described with reference to FIG. 4A.

The precursor mask 430 is modified to or replaced with a mask 400 including a mask opening 401 that exposes the trench 190 and a rim section 105 of the main surface 101a around the trench 190. A width Ls of the rim section 105 may be uniform around the circumference of the trench 190. The sidewalls of the mask opening 401 may be vertical or approximately vertical.

The semiconductor substrate 500a is irradiated from the front side. The irradiation may include irradiation with particle beams tilted to the vertical direction, wherein a tilt angle α from the vertical direction is selected such that the mask 400 shields lower portions of the sidewalls of the trench 190 against the tilted particle beam. The irradiation may include at least irradiation with two oppositely tilted particle beams with symmetric tilt angles α with respect to a vertical center plane extending along the horizontal longitudinal axis of the trench 190. According to an embodiment referring to trenches 190 with a horizontal longitudinal extension equal to or not exceeding more than ten times a horizontal transverse extension, irradiation may include four implants tilted to a vertical center axis by the tilt angle α along four orthogonal directions. The irradiation may further include irradiation with a vertical particle beam.

The tilted particle beams irradiate only upper portions of the trench sidewalls and the exposed rim section 105 thereby amorphizing also portions of the semiconductor layer 100a in the vertical projection of the mask 400 to the effect that after irradiation with the tilted particle beams the crystal lattice in the upper portions of the trench sidewalls and the exposed rim section 105 is less perfect than before and at a scale from perfectly crystalline to fully amorphous, the upper portions of the trench sidewalls and the exposed rim section 105 get closer to the amorphous end.

FIG. 5B shows a amorphized first portion 181 including first, second and third sections 181a, 181b, 181c resulting from a particle beam irradiated vertically and approximately corresponding to the first, second and third sections of the amorphized first portion 181 of FIG. 4B. In addition, the tilted particle beams amorphize a second portion 182 in the vertical projection of sections of the mask 400. Since the range of the particle beam in the lateral direction along the main surface 101a is dominated by the range of the particles in the silicon carbide crystal and less dominated by scattering, the contour of the amorphized second portion 182 smoothly adapts to both the main surface 101a and the second section 181b of the first portion 181.

FIG. 5C shows the trench 190 after removal of the mask 400 and the amorphized first and second portions 181, 182. The rim of the resulting trench 190 is chamfered and/or rounded and includes a tapering surface section 142a which contour is defined by the amorphized second portion 182 and the second section 181b of the first portion 181.

FIGS. 6A to 6E refer to a process for forming trench gate structures for silicon carbide devices such as MGDs (MOS controlled diodes), IGFETs (insulated gate field effect transistors), e.g., MOSFETs (metal oxide semiconductor FETs) in the usual meaning including both IGFETs with metal and non-metal gates, or IGBTs (insulated gate bipolar transistors).

A semiconductor substrate 500a includes a semiconductor layer 100a that may include a heavily $n^+$-doped base substrate 100s and a weakly doped $n^-$-type epitaxy layer 100e, which may be formed by epitaxy on a process surface of the base substrate 100s. The semiconductor layer 100a may be cylindrical with a main surface 101a at a front side and a supporting surface 102a on the back opposite to the main surface 101a. A multi-layer precursor mask system 430a including a first mask layer 431a and a second mask layer 432a is deposited onto the main surface 101a. A photoresist layer on the mask system 430a is patterned by lithography to form a resist mask 710 with a resist opening 711.

Figure 6A:
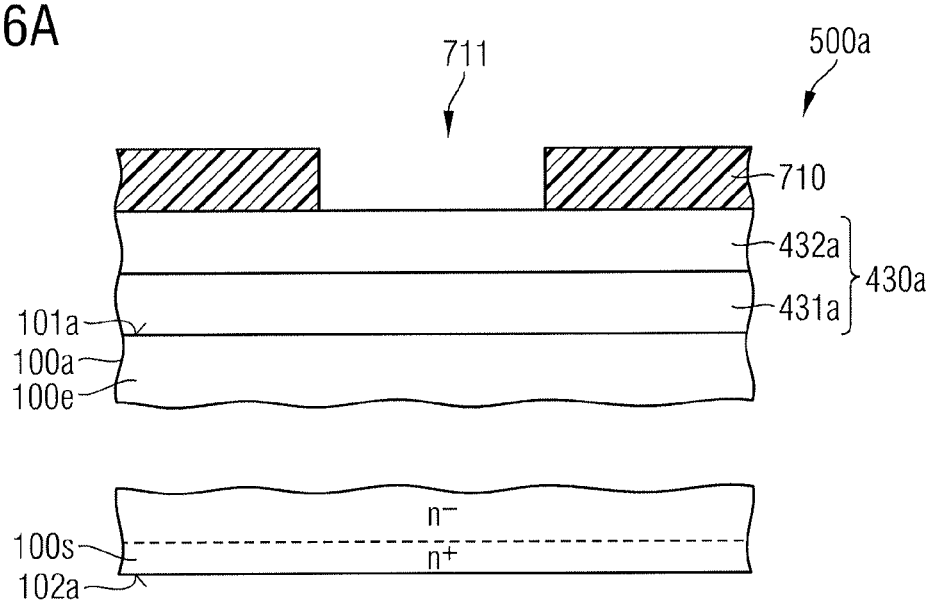
FIG. 6A is a schematic vertical cross-sectional view of a portion of a semiconductor substrate for illustrating a method of manufacturing a semiconductor device with trench gate structures, after patterning a photoresist layer on a multi-layer mask.

FIG. 6A shows the precursor mask system 430a and the resist mask 710 including the resist opening 711. The materials of the first and second mask layers 431a, 432a may be different, such that they can be etched differently. According to an embodiment the materials of the first and second mask layer 431a, 432a may be selected such that the second mask layer 432a recesses faster than the first mask layer 431a in a same etching solution. According to an embodiment, both the first and the second mask layer 431a, 432a consist of or include deposited silicon oxide, wherein a density of the second mask layer 432a is lower than a density of the first mask layer 431a. For example, the first and second mask layers 431a, 432a are deposited by CVD (chemical vapor deposition) that uses TEOS (tetraethylorthosilicate) as precursor material, wherein the second mask layer 432a is deposited under conditions resulting in a higher density, or, wherein a heating treatment after deposition of the first mask layer 431a densifies the first mask layer 431a before deposition of the second mask layer 432a.

A highly anisotropic etch opens the precursor mask system 430a to form a precursor mask 430 with a precursor mask opening 439 in the vertical projection of the resist opening 711. A reactive ion etching process forms a trench 190 in the semiconductor layer 100a in the vertical projection of the precursor mask opening 439.

Figure 6B:
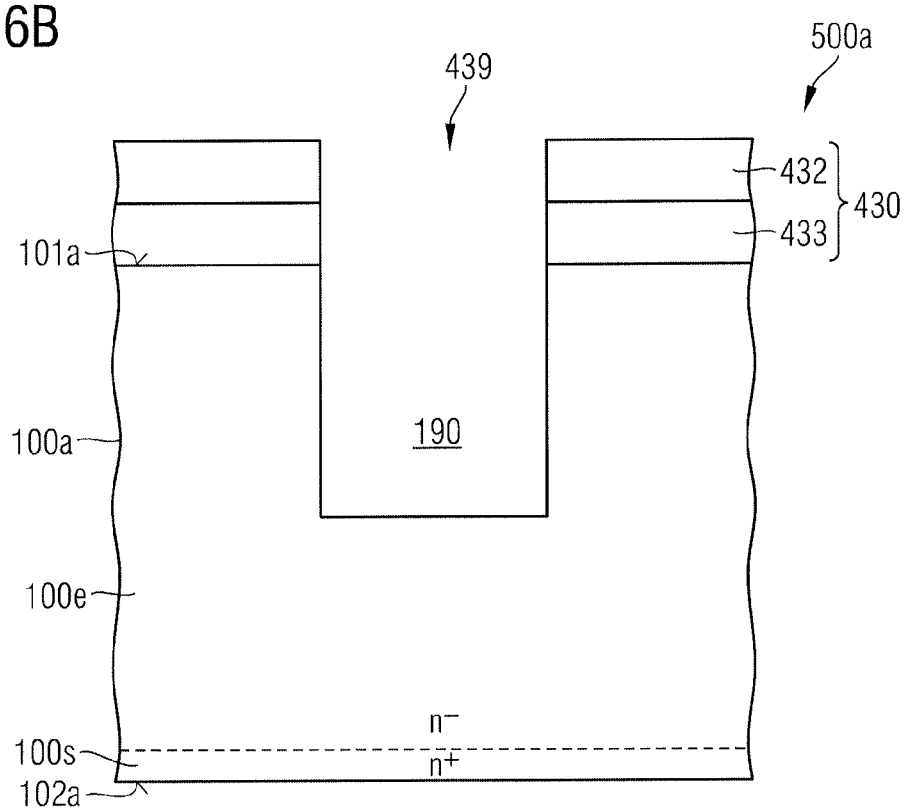
FIG. 6B shows the semiconductor substrate portion of FIG. 6A after forming a trench in the substrate by the use of the multi-layer mask.

FIG. 6B shows the trench 190 formed in the main surface 101a of the semiconductor layer 100a. The precursor mask 430 is subjected to a modification process that pulls back the precursor mask system 430a at least horizontally or horizontally and vertically to form, from the precursor mask 430 a mask 400 with a mask opening 401.

As illustrated in FIG. 6C, the modification may include a horizontal and vertical pullback of both the first and the second masks 431, 432 obtained from the first and second mask layers 431a, 432a. Due to the lower density of the second mask 432, the horizontal pullback of the remnant second mask portion 432x is greater than a horizontal pullback of the remnant first mask portion 431x. In addition, during the recess of the second mask 432, surface sections of the first mask 431 around the mask opening 401 are exposed to an isotropic etch process such that the remnant first mask portion 431x forms a tapering first mask section 411 that exposes a rim section 105 in the main surface 101a around the trench 190.

Particles implanted from the front side through the mask opening 401 and the tapering first mask section 411 amorphize exposed substrate portions in the vertical projection of the mask opening 401 and in the vertical projection of the tapering first mask section 411 to the effect that after implanting the particles from the front side, the crystal lattice in the exposed substrate portions is less perfect than before and at a scale from perfectly crystalline to fully amorphous, the exposed substrate portions get closer to the amorphous end.

FIG. 6D shows amorphized first and second portions 181, 182, wherein the amorphized first portion 181 includes a first section 181a at a bottom of the trench 190, a second section 181b in the vertical projection of the exposed rim section 105 of the main surface 101a, and a third section 181c along the trench sidewall. Removing the amorphized first and second portions 181, 182 results in a trench 190 with rounded and/or beveled corners at the bottom and at the rim as illustrated in FIG. 4C.

A gate dielectric 151 may be formed that lines the trench 190. A conductive material may be deposited to form a gate electrode 155 that fills the remaining void in the trench 190 lined by the gate dielectric 151. Then or at a previous process stage, source zones, body zones, diode regions and current spread zones may be formed, for example by using masked implants.

FIG. 6E shows a transistor cell TC including a trench gate structure 150 formed in the trench 190 of FIG. 6D. The epitaxy layer 100e may include source zones, body zones, diode regions, current spread zones and a drift zone 121. The base substrate 100s may form a contact layer.

Figure 7A:
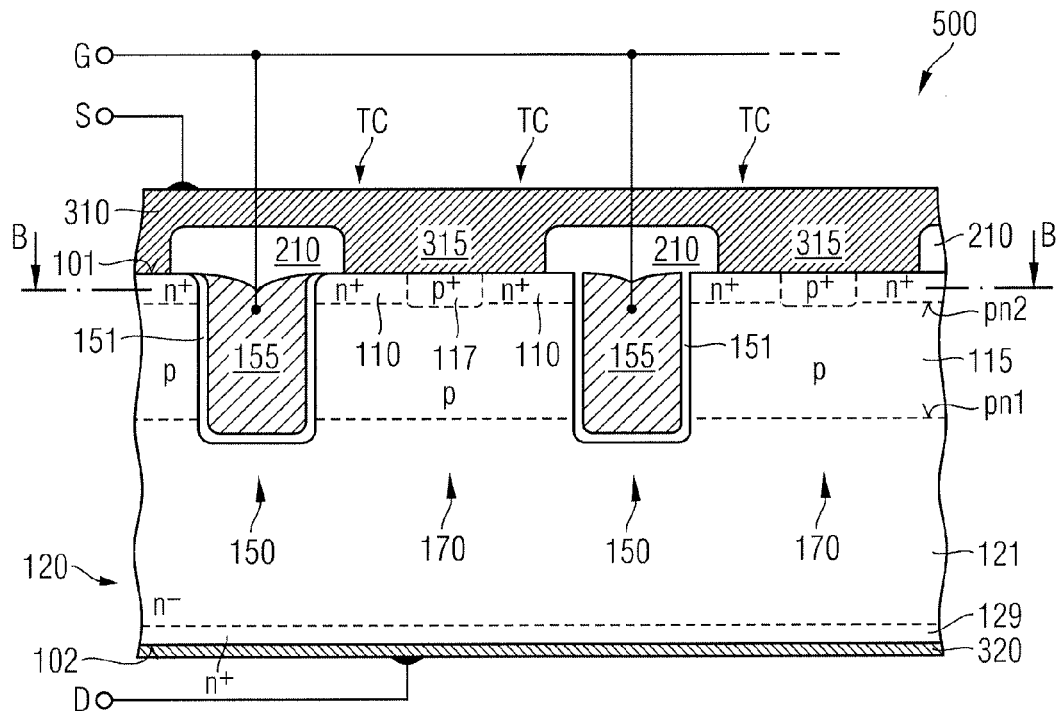
FIG. 7A is a schematic vertical cross-sectional view of a UMOSFET according to an embodiment related to a symmetric transistor cell layout with planar source and body contacts.
Figure 7B:
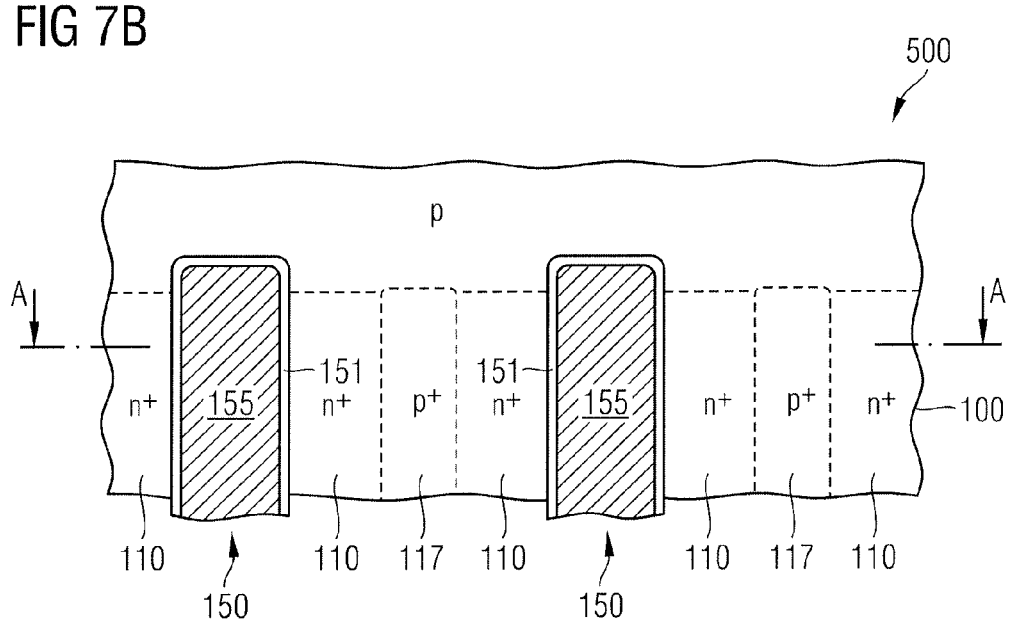
FIG. 7B is a schematic horizontal cross-sectional view of the semiconductor device portion of FIG. 7A along line B-B.

FIGS. 7A to 7B refer to an SiC semiconductor device 500 including transistor cells TC, wherein the semiconductor device 500 may be or may include an UMOSFET with U-shaped trench gate structures 150 extending from a first surface 101 into a semiconductor body 100, and wherein a rim and corners at the bottom of the trench gate structure 150 are chamfered and/or rounded according to one of the above described methods. The semiconductor body 100 may be based on 4H—SiC, 2H—SiC, 6H—SiC or 15R—SiC.

At a front side the semiconductor body 100 has a first surface 101, which may be planar or which may include coplanar surface sections, wherein the planar first surface or the coplanar surface sections may coincide with a main crystal plane or may be tilted to a main crystal plane by an off-axis angle, which absolute value may be at least 2° and at most 12°, e.g., about 4°. The first surface 101 may result from an epitaxy process and may be serrated. According to another embodiment, the first surface 101 is planar. For example, a chemical-mechanical polishing may planarize a serrated surface of an epitaxial layer and a passivation layer, e.g., a carbon layer, may suppress redeposition of silicon and carbon atoms along main crystal planes during following heating treatments.

On the back an opposite second surface 102 may extend parallel to the first surface 101. A distance between the first surface 101 at the front side and the second surface 102 on the back is related to a nominal blocking voltage the semiconductor device 500. Typically, the semiconductor body 100 includes a first vertical portion that accommodates the applied electric field in the blocking state, wherein the thickness of the first portion is proportional to the nominal blocking voltage and defines the electric field breakdown strength, whereas the thickness of further vertical portions, e.g., a substrate portion, is not related to the nominal blocking voltage.

A total thickness of the semiconductor body 100 between the first and second surfaces 101, 102 may be in the range of several hundred nm to several hundred μm. The normal to the first surface 101 defines a vertical direction. Directions parallel to the first surface 101 are horizontal directions.

The transistor cells TC are formed along trench gate structures 150, which extend from the first surface 101 into the semiconductor body 100, wherein portions of the semiconductor body 100 between neighboring trench gate structures 150 form mesa portions 170.

A longitudinal extension of the trench gate structures 150 along a first horizontal direction may be greater than a width along a second horizontal direction orthogonal to the first horizontal direction. The trench gate structures 150 may be long stripes extending from one side of a transistor cell area to an opposite side, wherein the length of the trench gate structures 150 may be up to several millimeters. According to other embodiments a plurality of separated trench gate structures 150 may be arranged along a line extending from one side of the transistor cell area to the opposite side, or the trench gate structures 150 may form a grid with the mesa portions 170 formed in the meshes of the grid.

The trench gate structures 150 may be equally spaced, may have equal width, and may form a regular pattern, wherein a pitch (center-to-center distance) of the trench gate structures 150 may be in a range from 1 μm to 10 μm, e.g., from 2 μm to 5 μm. A vertical extension of the trench gate structures 150 may be in a range from 0.3 μm to 5 μm, e.g., in a range from 0.5 μm to 2 μm.

The trench gate structures 150 include a conductive gate electrode 155 which may include or consist of a heavily doped polycrystalline silicon layer or a metal-containing layer. The trench gate structures 150 further include a gate dielectric 151 separating the gate electrode 155 from the semiconductor body 100 along at least one side of the trench gate structure 150. The gate dielectric 151 may include or consist of a semiconductor dielectric, for example thermally grown or deposited semiconductor oxide, e.g., silicon oxide, a semiconductor nitride, for example deposited or thermally grown silicon nitride, a semiconductor oxynitride, for example silicon oxynitride, any other deposited dielectric material or any combination thereof. The gate dielectric 151 may be formed for a threshold voltage of the transistor cells TC in a range from 1.5 V to 6 V.

The trench gate structures 150 may exclusively include the gate electrode 155 and the gate dielectric 151 or may include further conductive and/or dielectric structures in addition to the gate electrode 155 and the gate dielectric 151.

The trench gate structures 150 may be vertical to the first surface 101 or may taper with increasing distance to the first surface 101. For example, a taper angle of the trench gate structures 150 with respect to the vertical direction may be equal to the off-axis angle or may deviate from the off-axis angle by not more than ±1 degree such that first mesa sidewalls of the mesa portions 170 are formed by crystal planes providing high charge carrier mobility. For example, in a semiconductor body 100 with a hexagonal crystal lattice, the first mesa sidewalls may be formed by A-planes or M-planes. For the opposite second mesa sidewalls the taper angle may add to the off-axis angle and a resulting angular misalignment between the second mesa sidewalls and the crystal plane with high charge carrier mobility is the sum of the off-axis angle and the taper angle.

The mesa portions 170 include source zones 110 that are oriented to the front side and that directly adjoin to at least the first mesa sidewalls. The source zones 110 may directly adjoin to the first surface 101 and may also directly adjoin to the second mesa sidewalls or may be spaced from the second mesa sidewalls.

The mesa portions 170 further include body zones 115 that separate the source zones 110 from a drift structure 120, wherein the body zones 115 form first pn junctions pn1 with a drift structure 120 and second pn junctions pn2 with the source zones 110. The body zones 115 directly adjoin to the first mesa sidewalls and may also directly adjoin to the second mesa sidewalls. Portions of the body zones 115 are capacitively coupled to the gate electrode 155 through the gate dielectric 151. Both the source zones 110 and the body zones 115 are electrically connected to a first load electrode 310 at the front side, wherein heavily doped body contact zones 117 may form low-ohmic contacts between the first load electrode 310 and the body zones 115. A vertical extension of the body zones 115 corresponds to a channel length of the transistor cells TC and may be in a range from 0.2 μm to 1.5 μm.

The drift structure 120 is oriented to the back, may directly adjoin to the second surface 102 and may be electrically connected or coupled to a second load electrode 320 through an ohmic contact or through a further pn junction. The drift structure 120 may include a lightly doped drift zone 121 that may form the first pn junctions pn1 as well as a heavily doped contact layer 129 between the drift zone 121 and the second surface 102.

A net dopant concentration in the drift zone 121 may be in a range from 1E14 cm$^{-3}$ to 3E16 cm$^{-3}$ in case the semiconductor body 100 is formed from silicon carbide. A mean dopant concentration in the contact layer 129 is sufficiently high to ensure an ohmic contact with a second load electrode 320 that directly adjoins to the second surface 102. In case the semiconductor device 500 is a semiconductor diode or an IGFET, the contact layer 129 has the same conductivity type as the drift zone 121. In case the semiconductor device 500 is an IGBT, the contact layer 129 has the complementary conductivity type of the drift zone 121 or includes zones of the complementary conductivity type.

Each of the first and second load electrodes 310, 320 may consist of or contain, as main constituent(s), aluminum (Al), copper (Cu), or alloys of aluminum or copper such as AlSi, AlCu or AlSiCu. According to other embodiments, at least one of the first and second load electrodes 310, 320 may contain, as main constituent(s), nickel (Ni), titanium (Ti), tungsten (W), tantalum (Ta), vanadium (V), silver (Ag), gold (Au), tin (Sn), platinum (Pt), and/or palladium (Pd). One of the first and second load electrodes 310, 320 or both may include two or more sub-layers, wherein each sub-layer contains one or more of Ni, Ti, V, Ag, Au, W, Sn, Pt, and Pd as main constituent(s), e.g., a silicide, a nitride and/or an alloy.

The first load electrode 310 may form or may be electrically connected or coupled to a first load terminal, which may be an anode terminal of an MCD, a source terminal S of an UMOSFET or an emitter terminal of an IGBT. The second load electrode 320 may form or may be electrically connected or coupled to a second load terminal, which may be a cathode terminal of an MCD, a drain terminal D of an UMOSFET or a collector terminal of an IGBT.

According to an embodiment, the transistor cells TC are n-channel FET cells with p-doped body zones 115 and n-doped source zones 110, wherein the drift zone 121 is n-doped. According to another embodiment, the transistor cells TC are p-channel FET cells with n-doped body zones 115 and p-doped source zones 110, wherein the drift zone 121 is p-doped.

When a potential at the gate electrode 155 exceeds or falls below a threshold voltage of the semiconductor device 500, minority charge carriers in the body zones 115 form inversion channels connecting the source zones 110 with the drift structure 120, thereby turning on the semiconductor device 500. In the on-state, a load current flows through the semiconductor body 100 approximately along the vertical direction between the first and second load electrodes 310, 320.

An interlayer dielectric 210 sandwiched between the first load electrode 310 and the gate electrode 155 dielectrically insulates the first load electrode 310 from the gate electrode 155. The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

Contact structures 315 extend from the first load electrode 310 through openings in the interlayer dielectric 210 to the semiconductor body 100 and directly adjoin to at least the source zones 110 and to the body contact zones 117. According to the illustrated embodiment the contact structures 315 end on the first surface 101. According to other embodiments, the contact structures 315 may extend into the semiconductor body 100.

Rounding and/or chamfering of the rim and the bottom corners of the trench gate structures 150 increases reliability of the gate dielectric 151. Chamfering by amorphization avoids expensive high temperature heating treatments.

FIG. 7B shows that termination portions of the stripe-shaped trench gate structures 150 in the horizontal plane are rectangular with smoothly chamfered/rounded transitions between the long sides and the short sides.

Figure 8:
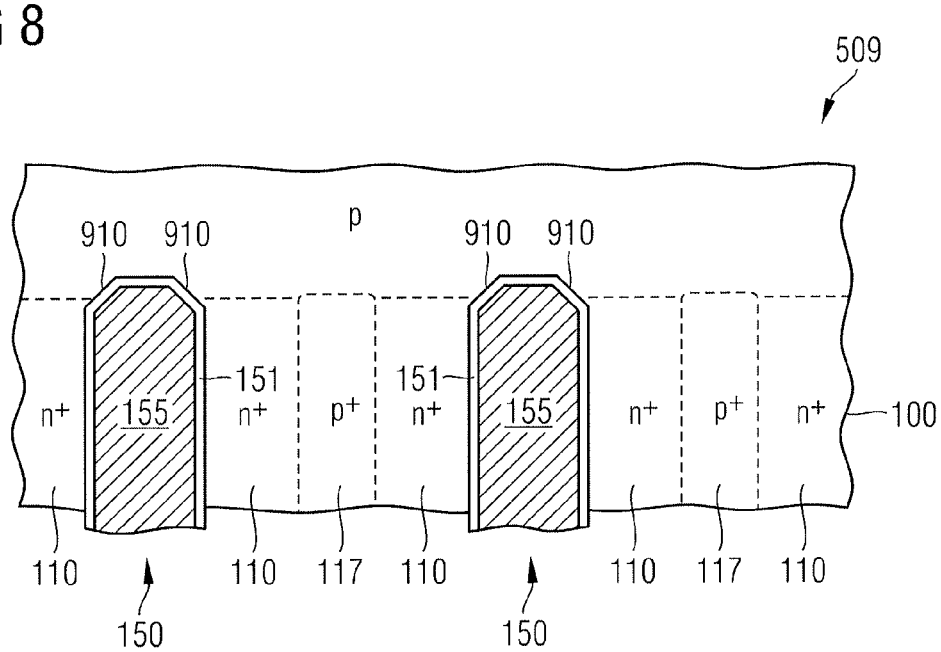
FIG. 8 is a schematic horizontal cross-sectional view of a portion of a reference example of a UMOSFET (vertical trench U-shape metal-oxide-semiconductor field effect transistor) including stripe-shaped trench gate structures for discussing effects of the embodiments, after a heating treatment at a temperature above 1500° C. for rounding trench corners.

FIG. 8 shows an end portion of a comparative device 501, for which a high temperature heating treatment rounds the rim and bottom corners of the trenches in which the trench gate structures 150 are formed.

The high temperature heating treatment results in a re-alignment re-deposition of the silicon carbide material along more stable crystal planes. As a result the termination portions of the stripe-shaped trench gate structures 150 form facets with straight tilted sections 910 between the long sides and the short sides of the trench gate structure 150. By contrast, as shown in FIG. 7B chamfering/rounding based on amorphization and low temperature processes avoids the formation of facets, re-deposition processes, and dopant segregation processes and results in a more reliable semiconductor device 500 with more reliable gate dielectric 151 and with tighter device specifications.

FIGS. 9A to 9F refer to the formation of stepped surface sections, for example for etched JTEs or contacts to lateral channels and shielding regions in SiC JFETs (junction field effect transistors) with a lateral channel portion between a gate and the shielding region as well as a vertical channel portion.

Figure 9A:
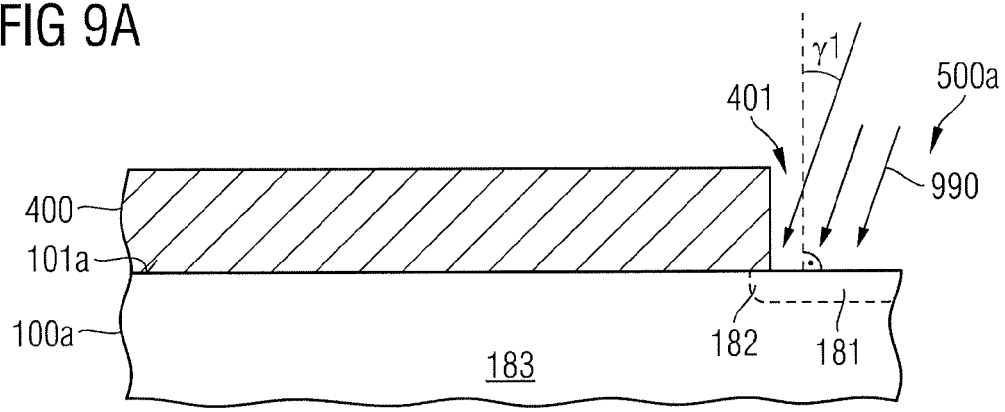
FIG. 9A is a schematic vertical cross-sectional view of a portion of a semiconductor substrate for illustrating a method of forming a JTE (junction termination extension) by amorphization during a first irradiation with a particle beam.

FIG. 9A shows a semiconductor substrate 500a including a semiconductor layer 100a consisting of or including crystalline SiC, for example, 2H—SiC, 6H—SiC, 15R—SiC or 4H—SiC. The semiconductor layer 100a may include a base substrate obtained by cutting a slice from a silicon carbide ingot as well as an epitaxial layer grown by epitaxy on a process surface of the base substrate.

A mask 400 with a mask opening 401 is formed on a main surface 101a of the semiconductor layer 100a. The mask 400 may include one single mask layer or may be a multi-layer mask including two or more sublayers sequentially deposited one onto the other. The mask 400 may be based on silicon oxide or silicon, by way of example. Sidewalls of the mask opening 401 may be vertical or may taper.

FIG. 9A shows a particle beam 990 impinging onto a section of the main surface 101a exposed by the mask opening 401 at a first implant angle γ1 with respect to the vertical direction. The first implant angle γ1 is in a range of 1 to 89°. The particle beam 990 amorphizes a first portion 181 of the semiconductor layer 100a in the vertical projection of the mask opening 401 and, by scattering effects, a second portion 182 covered by the mask 400 and directly adjoining to the first portion 181. A third portion 183 of the semiconductor layer 100a is shielded against the particle beam 990 by the mask 400. The particle beam 990 amorphizes the first and second portions 181, 182 to the effect that after irradiation with the particle beam 990 the crystal lattice in the first and second portions 181, 182 is less perfect than before. At a scale from perfectly crystalline to fully amorphous, the particle beam 990 brings the first and second portions 181, 182 closer to the amorphous end.

The amorphized first and second portions 181, 182 are removed by a wet etch that is selective to the mask 400. For example, the etchant includes fluorine and an oxidizing chemical such as FAEL in case the mask 400 is based on silicon.

Figure 9B:
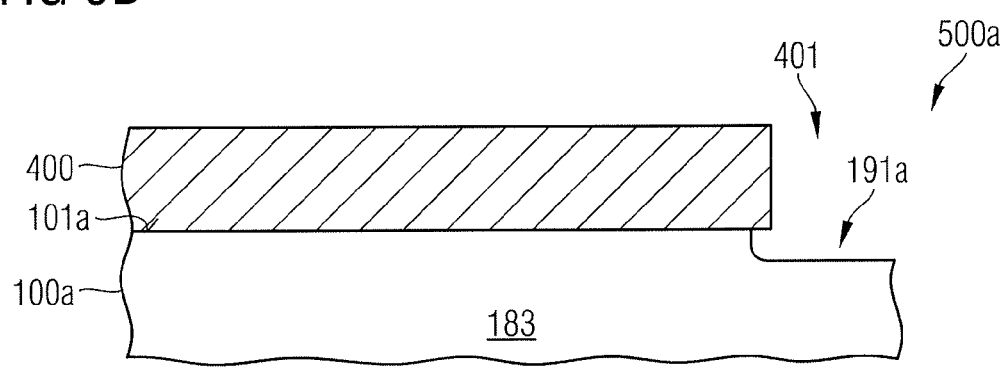
FIG. 9B shows the semiconductor substrate portion of FIG. 9A after removing portions amorphized by the first irradiation.

FIG. 9B shows the semiconductor substrate 500a after removal of the amorphized first and second portions 181, 182 of FIG. 9A, wherein a first recess 191a is formed in the main surface 101a. Then, the mask 400 may be modified such that the mask opening 401 is enlarged and exposes both the area of the first recess 191a obtained from the first etch and another portion of the main surface 101a directly adjoining to the first recess 191a. For example, a resist layer may be deposited and patterned by photolithography to horizontally recess the mask 400.

Figure 9C:
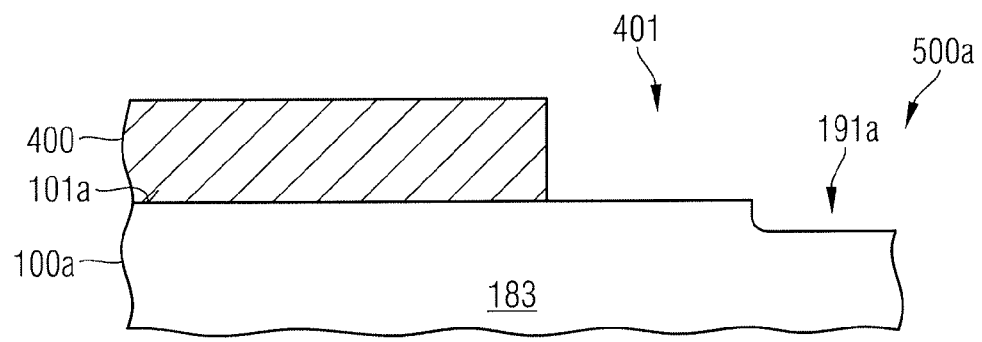
FIG. 9C shows the semiconductor substrate portion of FIG. 9B after modifying a mask.

FIG. 9C shows the modified mask 400 exposing the first recess 191a and a portion of the semiconductor layer 100a directly adjoining to the first recess 191a.

Figure 9D:
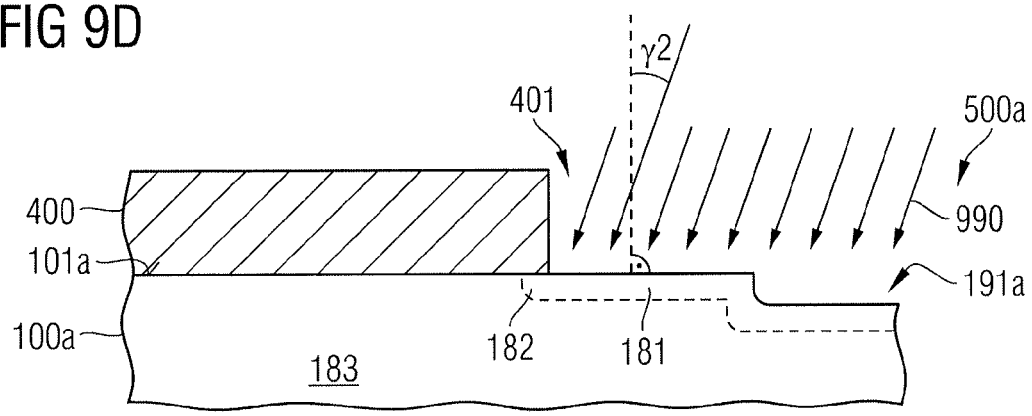
FIG. 9D shows the semiconductor substrate portion of FIG. 9C during a second irradiation with a particle beam.

FIG. 9D shows a second irradiation with a particle beam 990 at a second implant angle γ2 which may be equal to or which may differ from the first implant angle γ1. The particle beam 990 amorphizes a further first portion 181 in the vertical projection of the enlarged mask opening 401 and a further second portion 182 in the vertical projection of the modified mask 400.

Figure 9E:
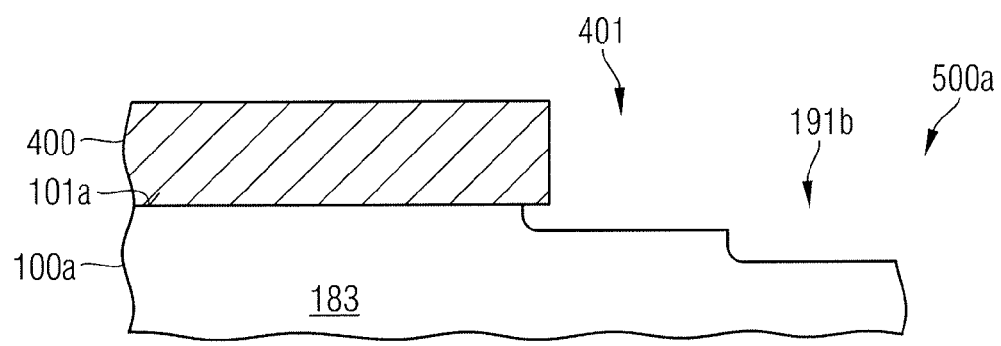
FIG. 9E shows the semiconductor substrate portion of FIG. 9D after removing portions amorphized by the second irradiation.

FIG. 9E shows the semiconductor substrate 500a after removal of the first and second portions 181, 182 amorphized during the second irradiation.

Laterally recessing the mask 400, irradiation with a particle beam 990 through the enlarged mask opening 401 and removal of the amorphized first and second portions 181, 182 may be repeated.

Figure 9F:
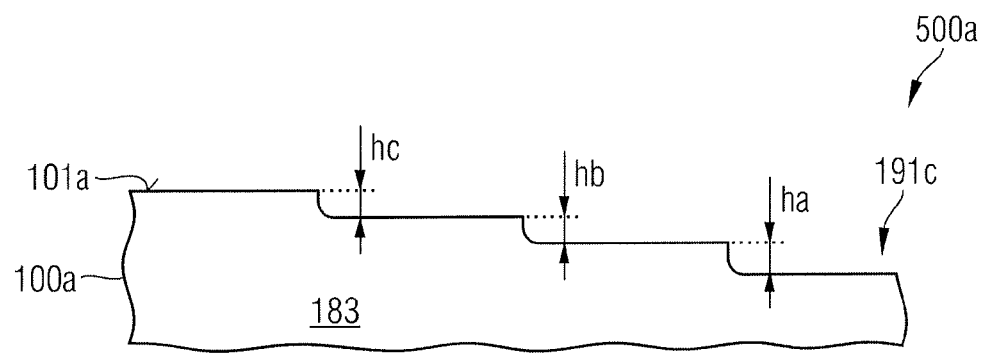
FIG. 9F shows the semiconductor substrate portion of FIG. 9E after removing portions amorphized during a third irradiation with a particle beam.

FIG. 9F shows the main surface 101a of the semiconductor layer 100a after removal of portions amorphized through a third irradiation. In contrast to conventional methods of forming stepped recesses in a silicon carbide substrate, e.g., by plasma etching, depth and height of the steps of the stepped recess 191c are defined by the range of the particle beam, which can be tuned and adjusted with high precision. Using ions/atoms of group 14 or group 18 elements or a 1:1 co-implant of silicon and carbon does not affect the dopant profiles.

Figure 10:
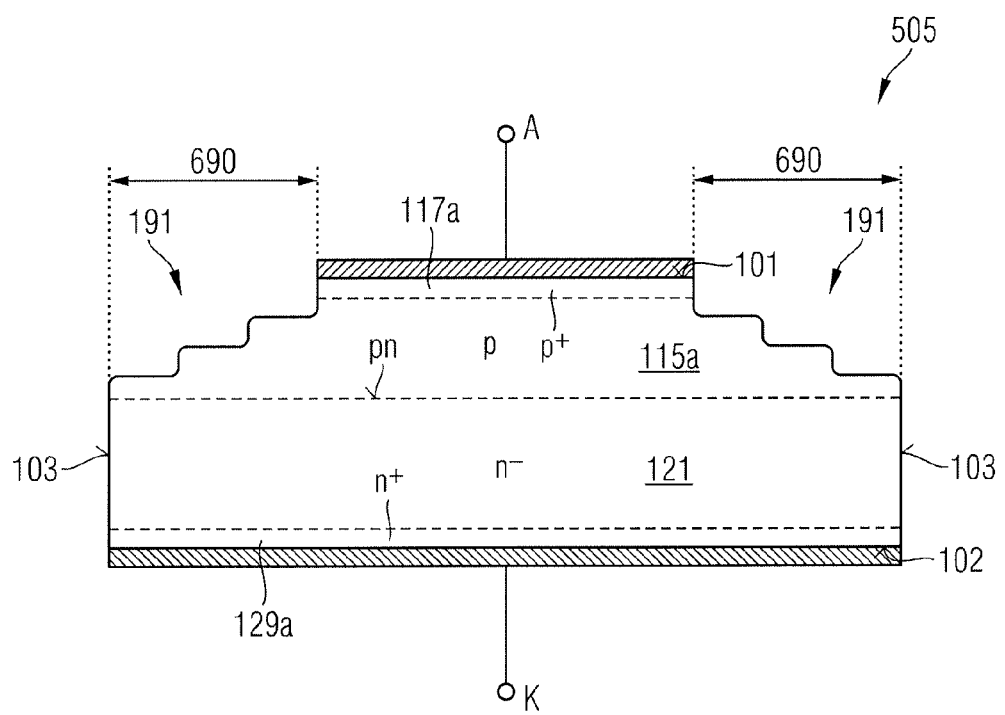
FIG. 10 is a schematic vertical cross-sectional view of a semiconductor diode including an etched JTE according to a further embodiment.

FIG. 10 shows a semiconductor diode 505 with a JTE that may be formed by the process as described with reference to FIGS. 9A to 9F.

At a front side, a heavily doped anode contact zone 117a extends from a first surface 101 into the semiconductor body 100. On the back, a heavily doped cathode contact zone 129a of the complementary conductivity type extends from the second surface 102 into the semiconductor body 100. A lightly doped drift zone 121 may form a unipolar homojunction with the cathode contact zone 129a and a pn junction pn with a lightly doped anode zone 115a that forms a unipolar homojunction with the anode contact zone 117a. An etched JTE structure 690 surrounds the anode zone 115a.

The etched JTE structure 690 includes steps that reduce the thickness of the semiconductor body 100 in direction to a lateral outer surface 103 of the semiconductor body 100. The etched JTE structure 690 handles high electric field strength at a low lateral extension compared to JTEs obtained by implanting JTE zones in a planar first surface 101.

While conventional etched JTEs rely on plasma etching with poor control of step height and depth, the JTE structure 690 of the semiconductor diode 505 relies on steps which height can be precisely defined by the parameters of the particle beam. Since the variation of the step height has a direct impact on the electric field distribution during a blocking state of the semiconductor diode, forming the JTE structure 690 by amorphization and wet etching results in low variations of the step height and the blocking capability may be tightly specified. By using a sequence of tapering masks as illustrated in FIGS. 3A to 3D, the steps may be rounded and/or chamfered to increase the blocking capability.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising
   forming a trench extending from a main surface into a crystalline silicon carbide semiconductor layer;
   forming a mask including a mask opening, the mask opening exposing the trench and a rim section of the main surface around the trench;
   amorphizing, by irradiation with a particle beam, a first portion of the semiconductor layer exposed by the mask opening and a second portion outside of the vertical projection of the mask opening and directly adjoining to the first portion, wherein a vertical extension of the amorphized second portion gradually decreases with increasing distance to the first portion; and
   removing the amorphized first and second portions.

2. The method of claim 1, wherein
   irradiation with the particle beam includes exposure to tilted particle beams tilted from a vertical direction perpendicular to the main surface at an angle, at which the mask shields a lower portion of a sidewall of the trench.

3. The method of claim 1, wherein
   irradiation with the particle beam includes exposure to a vertical particle beam orthogonal to the main surface.

4. The method of claim 1, wherein
   forming the mask includes forming first mask sections tapering with decreasing distance to the mask opening.

5. The method of claim 1, wherein
   forming the mask includes forming a precursor mask including a precursor mask opening for forming the trench and enlarging the precursor mask opening to form, from the precursor mask the mask exposing the trench and the rim section.

6. The method of claim 5, wherein
   forming the precursor mask includes forming a first mask layer on the main surface and forming a second mask layer on the first mask layer, wherein the second mask layer has a higher etch resistivity than the first mask layer.

7. The method of claim 6, wherein
   a first mask material of the first mask layer and a second material of the second mask layer contain identical constituents and the first material is denser than the second material.

8. The method of claim 5, wherein
   forming the mask includes horizontally pulling back the precursor mask.

9. The method of claim 1, wherein
the mask and the amorphized first and second portions are removed contemporaneously.

10. The method of claim 1, further comprising
forming a trench gate structure in the trench, wherein a gate dielectric lines the trench.

11. The method of claim 1, wherein
after irradiation with the particle beam the first and second portions are fully amorphous.

12. A method of manufacturing a semiconductor device, the method comprising
forming a mask on a crystalline silicon carbide semiconductor layer, wherein the mask includes a mask opening and a first mask section that tapers with decreasing distance to the mask opening;
amorphizing, by irradiation with a particle beam, a first portion of the semiconductor layer exposed by the mask opening and a second portion in a vertical projection of the first mask section and directly adjoining to the first portion, wherein a vertical extension of the second portion gradually decreases with increasing distance to the first portion; and
removing the amorphized first and second portions.

13. The method of claim 12, wherein
a reduction rate at which the vertical extension of the second portion decreases increases with decreasing distance to the first portion.

14. The method of claim 12, further comprising
forming, before forming the mask, a trench extending from the main surface into the semiconductor layer, wherein the mask opening is formed to expose the trench and a rim section of the main surface surrounding the trench.

15. The method of claim 12, wherein
an angle between a first interface between the mask and a non-amorphized third portion of the semiconductor layer and a second interface between the non-amorphized third portion and the amorphized second portion is at least 120 degree.

16. A method of manufacturing a semiconductor device, the method comprising
forming a mask including a mask opening on a crystalline silicon carbide semiconductor layer;
amorphizing, by irradiation with a particle beam, a first portion of the semiconductor layer exposed by the mask opening and a second portion in a vertical projection of the mask and directly adjoining to the first portion;
removing the amorphized first and second portions; and
repeating at least once amorphizing and removing of first and second portions to form a stepped recess, wherein the mask opening is enlarged before each amorphizing.

17. The method of claim 16, wherein
the mask is formed to include a first mask section that tapers with decreasing distance to the mask opening.

18. The method of claim 16, wherein
the particle beam includes ions and/or atoms selected from elements of group 14 and group 18.

19. The method of claim 16, wherein
the mask is a silicon mask.

20. The method of claim 16, wherein
the stepped recess includes steps of equal step height.

21. A method of manufacturing a semiconductor device, the method comprising
forming a trench extending from a main surface into a crystalline silicon carbide semiconductor layer;
forming a mask including a mask opening, the mask opening exposing the trench and a rim section of the main surface around the trench;
irradiating, with a particle beam, a first portion of the semiconductor layer exposed by the mask opening and a second portion outside of the vertical projection of the mask opening and directly adjoining to the first portion, wherein the particle beam damages a crystal lattice of the semiconductor layer in the first and second portions and a vertical extension of the second portion gradually decreases with increasing distance to the first portion; and
removing the first and second portions.

* * * * *